(12) United States Patent
Nagai et al.

(10) Patent No.: US 12,482,720 B2
(45) Date of Patent: Nov. 25, 2025

(54) SEMICONDUCTOR DEVICE HAVING ELECTRIC COMPONENT BUILT IN CIRCUIT BOARD

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Shohei Nagai, Nisshin (JP); Masaki Aoshima, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

(*) Notice: Subject to any disclaimer, the term of this patent is extended or adjusted under 35 U.S.C. 154(b) by 661 days.

(21) Appl. No.: 17/679,314

(22) Filed: Feb. 24, 2022

(65) Prior Publication Data

US 2022/0319953 A1    Oct. 6, 2022

(30) Foreign Application Priority Data

Mar. 30, 2021   (JP) ................. 2021-057203

(51) Int. Cl.
  *H01L 23/373*   (2006.01)
  *H01L 23/498*   (2006.01)

(52) U.S. Cl.
  CPC ........ *H01L 23/3736* (2013.01); *H01L 23/373* (2013.01); *H01L 23/49822* (2013.01)

(58) Field of Classification Search
  CPC ........ H05K 1/185; H05K 1/0298; H05K 1/11; H05K 1/14; H05K 1/0296; H05K 1/02; H05K 1/115; H05K 2201/0195; H01L 23/5389; H01L 23/367; H01L 25/072; H01L 25/16; H01L 25/18; H01L 24/19;
(Continued)

(56) References Cited

U.S. PATENT DOCUMENTS

| 5,497,033 | A | * | 3/1996 | Fillion | ................ H01L 23/4334 |
| | | | | | 257/E25.011 |
| 9,107,290 | B1 | | 8/2015 | Chen | |

(Continued)

FOREIGN PATENT DOCUMENTS

| CN | 1971863 A | * | 5/2007 | ............. H01L 24/19 |
| JP | 2001-85804 A | | 3/2001 | |

(Continued)

OTHER PUBLICATIONS

U.S. Appl. No. 17/679,622, filed Feb. 24, 2022, Nagai.
U.S. Appl. No. 17/679,603, filed Feb. 24, 2022, Nagai.

*Primary Examiner* — Eliseo Ramos Feliciano
*Assistant Examiner* — Timothy Edward Duren
(74) *Attorney, Agent, or Firm* — Posz Law Group, PLC (57) ABSTRACT

A semiconductor device includes a substrate main body having a first surface and a second surface, an electric component arranged in the substrate main body, a first internal conductor pattern arranged in a first circuit layer located between the first surface and the electric component, and at least one heat absorbing member. The at least one heat absorbing member is arranged inside the substrate main body and thermally connected to the first internal conductor pattern.

17 Claims, 8 Drawing Sheets

(58) Field of Classification Search
CPC ....... H01L 2224/04105; H01L 2224/19; H01L 2224/73267; H01L 2924/3025
USPC ........................................................ 257/700
See application file for complete search history.

(56) References Cited

U.S. PATENT DOCUMENTS

| | | | |
|---|---|---|---|
| 10,952,319 B1* | 3/2021 | Lee | ................. H01L 24/19 |
| 11,658,089 B2* | 5/2023 | Wakaiki | ............. H01L 21/4882 |
| | | | 257/717 |
| 2007/0074900 A1* | 4/2007 | Lee | ................. H01L 24/19 |
| | | | 257/E23.178 |
| 2010/0090335 A1 | 4/2010 | Chung | |
| 2012/0033385 A1 | 2/2012 | Nagasawa | |
| 2012/0043127 A1 | 2/2012 | Lin et al. | |
| 2012/0106084 A1 | 5/2012 | Mizuta et al. | |
| 2016/0037674 A1* | 2/2016 | Yamanaka | ............. H05K 7/205 |
| | | | 361/709 |
| 2016/0309575 A1 | 10/2016 | Min et al. | |
| 2020/0135633 A1* | 4/2020 | Moon | ................. H01L 23/481 |
| 2020/0388550 A1* | 12/2020 | Wakaiki | ............. H05K 1/0206 |

FOREIGN PATENT DOCUMENTS

| | | | | |
|---|---|---|---|---|
| JP | 2012209527 A | * | 10/2012 | ............. H01L 24/19 |
| JP | 5354394 B2 | * | 11/2013 | ............. H01L 24/19 |
| JP | 2016-171118 A | | 9/2016 | |
| JP | 2017-069474 A | | 4/2017 | |
| JP | 2021111683 A | * | 8/2021 | ............. H01L 23/12 |
| JP | 7358996 B2 | * | 10/2023 | ............. H01L 24/19 |

* cited by examiner

SEMICONDUCTOR DEVICE HAVING ELECTRIC COMPONENT BUILT IN CIRCUIT BOARD

CROSS REFERENCE TO RELATED APPLICATION

The present application claims the benefit of priority from Japanese Patent Application No. 2021-057203 filed on Mar. 30, 2021. The entire disclosure of the above application is incorporated herein by reference.

TECHNICAL FIELD

The present disclosure relates to a semiconductor device having an electrical component built in a circuit board.

BACKGROUND

A conceivable technique teaches a semiconductor device. This semiconductor device includes a substrate main body, an electric component arranged in the substrate main body, and a conductor pattern located on the upper surface of the substrate main body. The conductor pattern is thermally connected to the electronic component through a plurality of vias. According to such a configuration, the heat generated in the electronic component is transferred to the conductor pattern through the plurality of vias, and is radiated from the conductor pattern to the outside of the substrate main body.

SUMMARY

According to example embodiments, a semiconductor device may include a substrate main body having a first surface and a second surface, an electric component arranged in the substrate main body, a first internal conductor pattern arranged in a first circuit layer located between the first surface and the electric component, and at least one heat absorbing member arranged inside the substrate main body and thermally connected to the first internal conductor pattern.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In a structure of the above mentioned conceivable technique, the larger the area of the conductor pattern, the higher the heat radiation effect of the conductor pattern. However, if the area of the conductor pattern is increased, most of the surface of the substrate main body is largely occupied by the conductor pattern. In this case, it becomes difficult to provide other necessary configurations on the remaining surface of the substrate main body, and it may be necessary to increase the size of the substrate main body. In the conceivable structure, it is necessary to increase the size of the semiconductor device in order to avoid the temperature rise of the electric component, and it is necessary to allow the temperature rise of the electric component in order to avoid the increase in the size of the semiconductor device.

In view of the above, the present embodiments provide a semiconductor device having an electric component built in a circuit board, which can avoid an increase in size of the semiconductor device while suppressing a temperature rise of the electric component.

The semiconductor device according to the present embodiments includes: a substrate main body having a first surface and a second surface; an electric component arranged in the substrate main body, a first internal conductor pattern arranged in a first circuit layer located between the first surface and the electric component, and at least one heat absorbing member arranged inside the substrate main body and thermally connected to the first internal conductor pattern.

According to the above configuration, the heat generated by the electric component is transferred to the heat absorbing member in the substrate main body through the first internal conductor pattern in the substrate main body. As a result, most of the heat generated in the electric component is diffused in the substrate main body, and the temperature rise of the electric component is suppressed. Further, since the first internal conductor pattern and the heat absorbing member are provided in the substrate main body, other required configurations can be freely arranged on the first surface and the second surface of the substrate main body. As a result, it is possible to avoid an increase in the size of the semiconductor device.

In one embodiment of the present disclosure, the semiconductor device may further include a first surface conductor pattern 62 arranged in a circuit layer L1 located on the first surface and thermally connected to the first internal conductor pattern 64. According to such a configuration, the heat generated on the first surface of the substrate main body is also transferred to the heat absorbing member through the first surface conductor pattern and the first internal conductor pattern. As a result, it is possible to suppress a temperature rise of a heat generating source located on the first surface, such as an electric component arranged on the first surface of the substrate main body.

In the above-described embodiment, the semiconductor device may further include a surface electric component 52 arranged in the circuit layer located on the first surface and controlling the operation of the electric component. In this case, the first surface conductor pattern may be located close to the surface electric component. According to such a configuration, it is possible to suppress not only the temperature rise of the electric component in the substrate main body but also the temperature rise of the surface electric component that controls the operation of the electric component.

In one embodiment of the present disclosure, at least one heat absorbing member may include a plurality of heat absorbing parts. According to such a configuration, more heat can be absorbed and diffused by the plurality of heat absorbing parts, and the temperature rise of the electric component can be further suppressed.

In one embodiment of the present disclosure, the semiconductor device may further include a second internal conductor layer 74 provided in a circuit layer L5 located between the second surface and the electrical component. In this case, the at least one heat absorbing member may be thermally connected to the second internal conductor pattern. According to such a configuration, the heat generated in the electric component is further transferred to the heat absorbing member through the second internal conductor pattern. By arranging the electric component between the first internal conductor pattern and the second internal conductor pattern, the heat generated by the electric component can be effectively diffused from both sides of the electric component.

In one embodiment of the present disclosure, the semiconductor device may further include a second surface conductor pattern 69 arranged in a second circuit layer L6 located on the second surface and thermally connected to the second internal conductor pattern. According to such a configuration, the heat generated by the electric component can be transferred to the second surface conductor pattern through the second internal conductor pattern and radiated to the outside from the second surface conductor pattern. Thus, it is possible to further suppress the temperature rise of the electric component.

In one embodiment of the present disclosure, the at least one heat absorbing member may be made of metal or graphite. Here, the heat absorbing member may not be limited to metal or graphite, and may be a material or structure having a higher thermal conductivity than the substrate main body.

In one embodiment of the present disclosure, the at least one heat absorbing member may have a working fluid 91 enclosed therein, for example, a heat pipe or a heat spreader. According to such a configuration, the heat transfer efficiency in the heat absorbing member is increased, so that the heat absorbing property of the heat absorbing member can be effectively enhanced.

In one embodiment of the present absorbing, the semiconductor device may further include a heat transfer via 79 extending from the first internal conductor pattern to at least heat absorbing member. In this case, the material constituting the heat transfer via may have higher thermal conductivity than the material constituting the substrate main body. According to such a configuration, even when the first internal conductor pattern and the heat absorbing member are located in different layers, the heat transfer from the first internal conductor pattern to the heat absorbing member can be effectively enhanced.

In one embodiment of the present disclosure, the semiconductor device may further include a ground wiring 63 arranged on the first surface or the second surface of the substrate main body. In this case, the first internal conductor pattern may be electrically connected to the ground wiring in the substrate main body. According to such a configuration, the potential of the first internal conductor pattern is stabilized, so that the first internal conductor pattern facing the electric component also functions as a shield layer that shields the electromagnetic noise radiated from the electric component.

In the above-described embodiment, the material constituting the heat transfer via may be equal to the material constituting the first internal conductor pattern. With such a configuration, the manufacturing process of the semiconductor device can be simplified.

Embodiment 1

The semiconductor device 10 of the first embodiment will be described with reference to the drawings. The semiconductor device 10 of this embodiment is adopted, for example, in a power control unit of an electric vehicle, and can form a part of a power conversion circuit for power conversion between a power supply and a traveling motor. The electric vehicle in the present embodiment broadly means a vehicle having a motor for driving wheels, and for example, an electric vehicle charged by an external electric power, a hybrid vehicle having an engine in addition to the motor, a fuel cell vehicle having a fuel cell as the power source and the like. However, the application of the semiconductor device 10 according to the embodiment may not be limited to the electric vehicle, and may be applied to a variety of electrical apparatuses.

Figure 1:
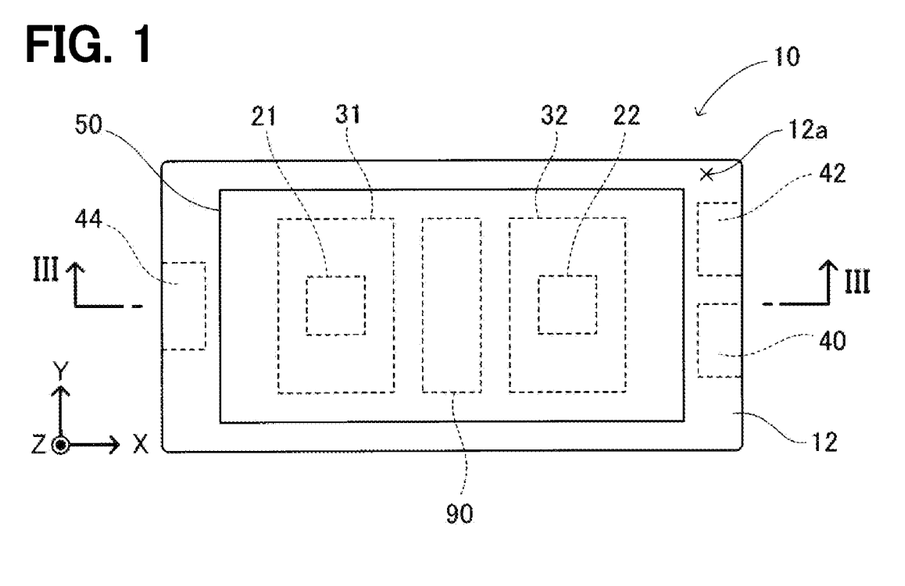
FIG. 1 is a plan view showing a semiconductor device of the first embodiment.
Figure 2:
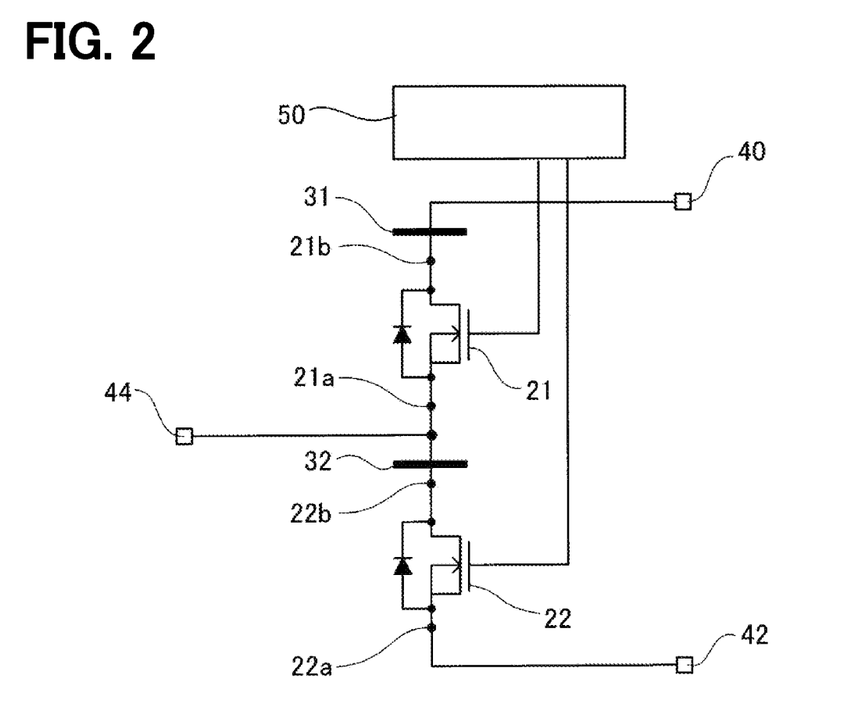
FIG. 2 is a circuit diagram showing a circuit structure of the semiconductor device of the first embodiment.
Figure 3:
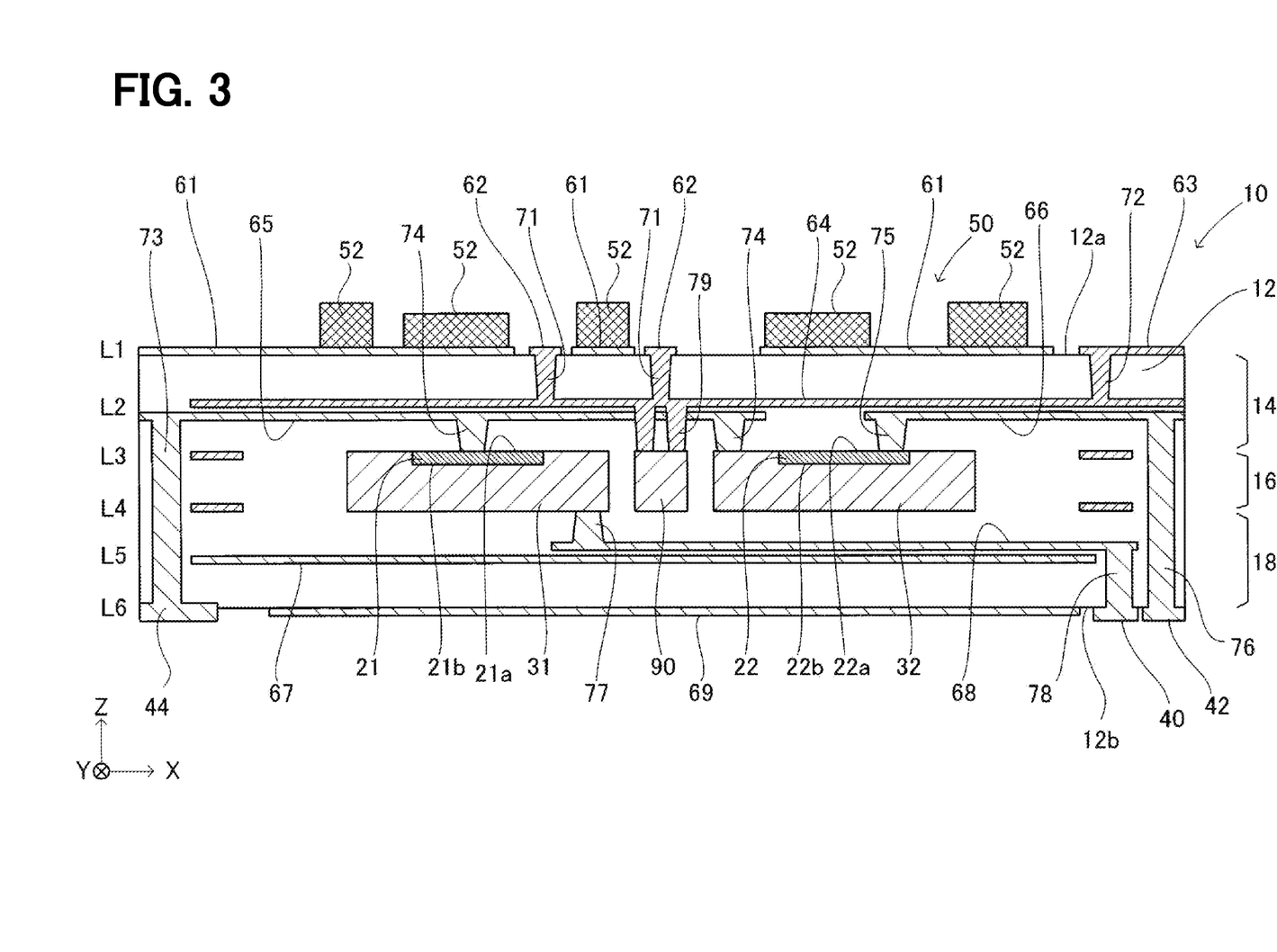
FIG. 3 is a cross-sectional view taken along the line III-III in FIG. 1, and for clarity of the drawing, hatching of the substrate main body is omitted, and further, some of the overlapping configurations are shown by intentionally changing their positions.
Figure 4A:
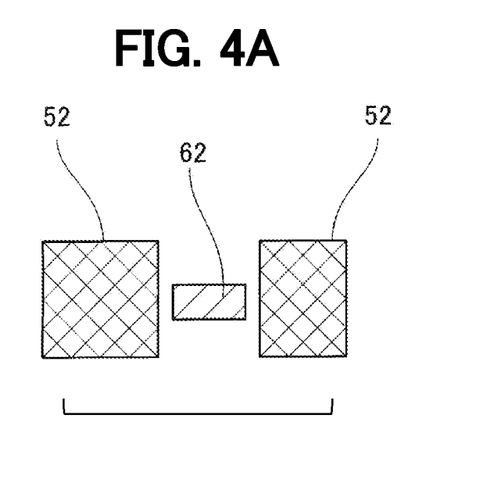
FIGS. 4A to 4D are diagrams showing a variation of the arrangement pattern of the second conductor pattern with respect to the surface electric component.
Figure 4B:
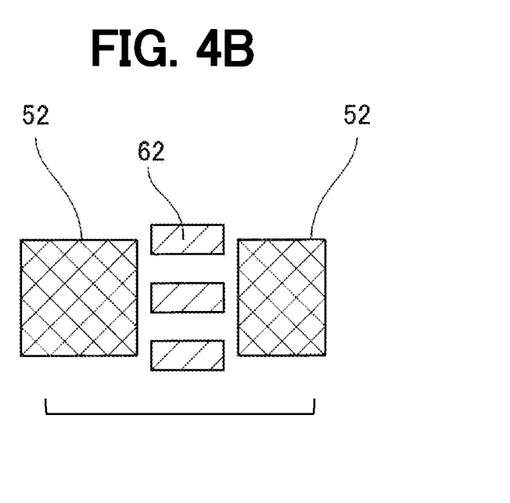
Figure 4C:
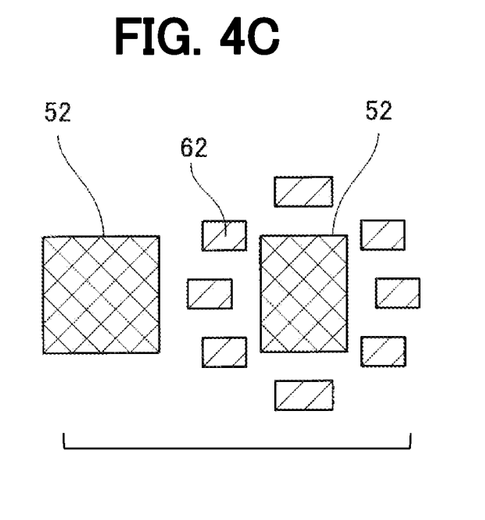
Figure 4D:
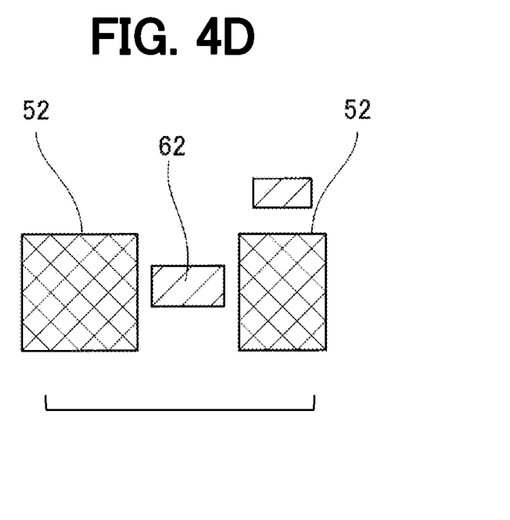

As shown in FIGS. 1 to 3, the semiconductor device 10 includes a substrate main body 12, two semiconductor elements 21 and 22, and two heat sink plates 31 and 32. The substrate main body 12 has a boarded shape or a plate-like shape. The substrate main body 12 has an upper surface 12a and a lower surface 12b. The lower surface 12b is arranged at a side opposite to the upper surface 12a. The substrate main body 12 is made of an insulator such as an epoxy resin. The substrate main body 12 includes an upper layer 14, an intermediate layer 16, and a lower layer 18 in an order from the upper surface 12a to the lower surface 12b. The upper layer 14 is a layer including the upper surface 12a of the substrate main body 12. The lower layer 18 is a layer including the lower surface 12b of the substrate main body 12. The intermediate layer 16 is a layer arranged between the upper layer 14 and the lower layer 18.

X-direction and Y-direction in the drawings are directions parallel to the upper surface 12a and the lower surface 12b of the substrate main body 12, and are directions perpendicular to each other. Z-direction is a direction perpendicular to the upper surface 12a and the lower surface 12b of the substrate main body 12, and is a direction perpendicular to each of the X-direction and the Y-direction. That is, the above-mentioned upper layer 14, the intermediate layer 16 and the lower layer 18 are stacked along the Z direction.

The semiconductor elements 21 and 22 and the heat sink plates 31 and 32 are electric components that form a part of an electric circuit in the semiconductor device 10, respectively. The two semiconductor elements 21 and 22 are arranged in the intermediate layer 16 of the substrate main body 12 together with the two heat sink plates 31 and 32. Each of the semiconductor elements 21 and 22 us a power semiconductor element, and in particular, a switching element. This switching element may be, for example, an Insulated Gate Bipolar Transistor (IGBT) or a Metal-Oxide-Semiconductor Field-Effect Transistor (MOSFET).

The semiconductor elements 21 to 22 respectively have upper surface electrodes 21a to 22a and lower surface electrodes 21b to 22b, and respectively conduct electricity or block an electrical conduction between the corresponding upper surface electrodes 21a to 22a and the corresponding lower surface electrodes 21b to 22b.

As an example, the two semiconductor elements 21 and 22 include a first semiconductor element 21 and a second semiconductor element 22. The first semiconductor element 21 and the second semiconductor element 22 are electrically connected in series inside the substrate main body 12. As described above, the two semiconductor elements 21 and 22 are switching elements such as IGBTs or MOSFETs. The semiconductor device 10 of this embodiment can form, for example, a part of an inverter circuit or a DC-DC converter circuit. The number of semiconductor elements 21 and 22 may not be limited to two. Further, the semiconductor device 10 may include at least one electric component other than or in addition to the semiconductor elements 21 and 22 and the heat sink plates 31 and 32.

The two heat sink plates 31 and 32 each have a plate-like shape and are arranged in parallel with the substrate main body 12. Each heat sink plate 31, 32 is made of a conductor, for example copper or other metal. As an example, the two heat sink plates 31 and 32 are arranged along the X direction. The two heat sink plates 31 and 32 include a first heat sink plate 31 and a second heat sink plate 32. A first semiconductor element 21 is arranged on the first heat sink plate 31, and the lower surface electrode 21b of the first semiconductor element 21 is electrically connected to the first heat sink plate 31. The first semiconductor element 21 and the first heat sink plate 31 are integrally joined to each other and may be interpreted as one electric component. Similarly, the second semiconductor element 22 is arranged on the second heat sink plate 32, and the lower surface electrodes 21b and 22b of the second semiconductor element 22 are electrically connected to the second heat sink plate 32. The second semiconductor element 22 and the second heat sink plate 32 are also integrally bonded to each other and may be interpreted as one electric component.

The semiconductor device 10 includes a plurality of terminals 40, 42, 44. These terminals 40, 42, and 44 are external connection terminals for connecting to an external circuit. The plurality of terminals 40, 42, 44 are made of a conductor such as copper or other metal. As an example, the plurality of terminals 40, 42, and 44 include a P terminal 40, an N terminal 42, and an O terminal 44. The plurality of terminals 40, 42, and 44 are arranged on the lower surface 12b of the substrate main body 12. Here, a part or all of the plurality of terminals 40, 42, 44 may be arranged on the upper surface 12a of the substrate main body 12. As a result, when the first semiconductor element 21 is turned on, the P terminal 40 and the O terminal 44 are electrically connected to each other. On the other hand, when the second semiconductor element 22 is turned on, the N terminal 42 and the O terminal 44 are electrically connected to each other.

The P terminal 40 is electrically connected to the first heat sink plate 31 inside the substrate main body 12, and is electrically connected to the lower surface electrode 21b of the first semiconductor element 21 through the first heat sink plate 31. The N terminal 42 is electrically connected to the upper surface electrode 22a of the second semiconductor element 22 inside the substrate main body 12. The O terminal 44 is electrically connected to the upper surface electrode 21a of the first semiconductor element 21 and the second heat sink plate 32 inside the substrate main body 12. That is, the O terminal 44 is electrically connected to each of the upper surface electrode 21a of the first semiconductor element 21 and the lower surface electrode 22b of the second semiconductor element 22.

The substrate main body 12 is provided with a plurality of circuit layers L1-L6 to form a multi-layer substrate structure. The plurality of circuit layers L1-L6 include a first circuit layer L1, a second circuit layer L2, a third circuit layer L3, a fourth circuit layer L4, a fifth circuit layer L5, and a sixth circuit layer L6. The first circuit layer L1 is arranged on the upper surface 12a of the substrate main body 12. The second circuit layer L2 is arranged in the upper layer 14 of the substrate main body 12. The third circuit layer L3 is arranged at the boundary between the upper layer 14 and the intermediate layer 16 of the substrate main body 12. The fourth circuit layer L4 is arranged at the boundary between the intermediate layer 16 and the lower layer 18 of the substrate main body 12. The fifth circuit layer L5 is arranged in the lower layer 18 of the substrate main body 12. The sixth circuit layer L6 is arranged on the lower surface 12b of the substrate main body 12.

The first circuit layer L1 has a plurality of conductor patterns 61, 62, 63. Each conductor pattern 61, 62, 63 is made of a conductor such as copper or other metal. The plurality of conductor patterns 61, 62, 63 include a second conductor pattern 62, and a third conductor pattern 63. The first conductor pattern 61 constitutes a control circuit 50 that controls two semiconductor elements 21 and 22. Therefore, a plurality of surface electric components 52 are mounted on the first conductor pattern 61. The plurality of surface electric components 52 include, for example, a gate drive circuit that controls switching of the semiconductor elements 21 and 22.

The first conductor pattern 61 referred to here is a general term for one or more conductor patterns required to form the control circuit 50. That is, the first conductor pattern 61 may be a single conductor pattern or a combination of a plurality of conductor patterns. The same applies to the second conductor pattern 62 to the ninth conductor pattern 69 described below. Each of the second conductor pattern 62 to the ninth conductor pattern 69 is a general term for one or more conductor patterns having a common function, and may be a single conductor pattern or a combination of a plurality of conductor patterns.

The second conductor pattern 62 is provided adjacent to the surface electric component 52. As a result, the heat generated by the surface electric component 52 is configured to be transferred to the second conductor pattern 62. Here, the second conductor pattern 62 is electrically insulated from the first conductor pattern 61 and the surface electric component 52 on the upper surface 12a of the substrate main body 12. The third conductor pattern 63 is a part of the control circuit 50 and functions as a ground wiring connected to the ground potential.

FIGS. 4A to 4D show some specific examples about the arrangement of the second conductor pattern 62. As shown in FIGS. 4A to 4D, the number of the second conductor patterns 62 and the positional relationship with the surface electric component 52 may not be particularly limited. The second conductor pattern 62 may be a single region or a combination of a plurality of regions. Further, the second conductor pattern 62 may be located between two adjacent surface electric components 52, or may be provided so as to surround one or a plurality of surface electric components 52.

The second circuit layer L2 has a plurality of conductor patterns 64, 65, 66. Each conductor pattern 64, 65, 66 is made of a conductor such as copper or other metal. The plurality of conductor patterns 64, 65, 66 include a fourth conductor pattern 64, a fifth conductor pattern 65, and a sixth conductor pattern 66. Here, the plurality of conductor patterns 64, 65, 66 are actually arranged on the same plane, but in FIG. 3, the fourth conductor pattern 64 is intentionally displaced with respect to the fifth conductor pattern 65 and the sixth conductor pattern 66 for the purpose of clarifying the illustration.

The fourth conductor pattern 64 extends over most of the second circuit layer L2 and is provided so as to face the plurality of semiconductor elements 21 and 22. As a result, the heat generated in the semiconductor elements 21 and 22 is diffused to a wide range of the substrate main body 12 through the fourth conductor pattern 64. The fourth conductor pattern 64 also functions as a shield layer that shields electromagnetic noise radiated from the semiconductor elements 21 and 22. The fourth conductor pattern 64 is connected to the second conductor pattern 62 of the first circuit layer L1 through one or more first vias 71. In addition, the fourth conductor pattern 64 is also connected to the third conductor pattern 63 of the first circuit layer L1 through one or more second vias 72. The first via 71 and the second via 72 are made of a conductor such as copper or other metal. As a result, the fourth conductor pattern 64 is electrically and thermally connected to the second conductor pattern 62 and the third conductor pattern 63 of the first circuit layer L1.

As described above, the second conductor pattern 62 of the first circuit layer L1 is provided adjacent to the surface electric component 52. Therefore, the heat generated by the surface electric component 52 is transferred from the second conductor pattern 62 of the first circuit layer L1 to the fourth conductor pattern 64 through the first via 71. As a result, the heat generated by the surface electric component 52 also diffuses over a wide range of the substrate main body 12 through the fourth conductor pattern 64. In addition, the fourth conductor pattern 64 is electrically connected to the third conductor pattern 63 of the first circuit layer L1, that is, the ground wiring, so that the function of the fourth conductor pattern 64 as a shield layer is improved.

The fifth conductor pattern 65 is connected to the O terminal 44 through the third via 73. In addition, the fifth conductor pattern 65 is connected to the upper surface electrode 21*a* of the first semiconductor element 21 and the second heat sink plate 32 through two fourth vias 74. The third via 73 and the fourth via 74 are made of a conductor such as copper or other metal. As a result, the two semiconductor elements 21 and 22 are electrically connected in series by the fifth conductor pattern 65 and electrically connected to the O terminal 44 through the fifth conductor pattern 65.

The sixth conductor pattern 66 is connected to the upper surface electrode 22*a* of the second semiconductor element 22 through the fifth via 75. In addition, the sixth conductor pattern 66 is connected to the N terminal 42 through the sixth via 76. The fifth via 75 and the sixth via 76 are made of a conductor such as copper or other metal. As a result, the upper surface electrode 22*a* of the second semiconductor element 22 is electrically connected to the N terminal 42 through the sixth conductor pattern 66.

Semiconductor elements 21 and 22 and heat sink plates 31 and 32 are arranged in the third circuit layer L3 and the fourth circuit layer L4. The heat sink plates 31 and 32 have a thickness equal to the distance from the third circuit layer L3 to the fourth circuit layer L4. The semiconductor elements 21 and 22 arranged on the heat sink plates 31 and 32 are arranged in the third circuit layer L3.

The fifth circuit layer L5 has a plurality of conductor patterns 67, 68. Each conductor pattern 67, 68 is made of a conductor such as copper or other metal. The plurality of conductor patterns 67 and 68 include a seventh conductor pattern 67 and an eighth conductor pattern 68. Here, the plurality of conductor patterns 67, 68 are actually arranged on the same plane, but in FIG. 3, the seventh conductor pattern 67 is intentionally displaced with respect to the eighth conductor pattern 68 for the purpose of clarifying the illustration.

The seventh conductor pattern 67 extends over most of the fifth circuit layer L5 and is provided so as to face the plurality of semiconductor elements 21 and 22. As a result, the heat generated in the semiconductor elements 21 and 22 is diffused to a wide range of the substrate main body 12 through the seventh conductor pattern 67. The seventh conductor pattern 67 also functions as a shield layer that shields electromagnetic noise radiated from the semiconductor elements 21 and 22. Although not shown, the seventh conductor pattern 67 may be electrically connected to the third conductor pattern 63 of the first circuit layer L1, that is, the ground wiring, thereby improving a function of a shield layer of the seventh conductor pattern 67.

The eighth conductor pattern 68 is connected to the first heat sink plate 31 through the seventh via 77. In addition, the eighth conductor pattern 68 is connected to the P terminal 40 through the eighth via 78. The seventh via 77 and the eighth via 78 are made of a conductor such as copper or other metal. As a result, the lower surface electrode 21*b* of the first semiconductor element 21 is electrically connected to the P terminal 40 through the first heat sink plate 31 and the eighth conductor pattern 68.

The sixth circuit layer L6 has a ninth conductor pattern 69. The ninth conductor pattern 69 extends over most of the sixth circuit layer L6 and faces the seventh conductor pattern 67 of the fifth circuit layer L5. As a result, the heat generated in the semiconductor elements 21 and 22 is first transferred to the seventh conductor pattern 67 of the fifth circuit layer L5, and then to the ninth conductor pattern 69 of the sixth circuit layer L6. As a result, the heat generated by the semiconductor elements 21 and 22 is widely diffused in the substrate main body 12 and radiated from the ninth conductor pattern 69 to the outside of the substrate main body 12.

The semiconductor device 10 further includes an heat absorbing member 90. The heat absorbing member 90 is located inside the substrate main body 12. The heat absorbing member 90 may be made of a material having excellent thermal conductivity, and may be made of, for example, copper or other metal or graphite. The heat absorbing member 90 is located in the intermediate layer 16 of the substrate main body 12, similar to the semiconductor elements 21 and 22 and the heat sink plates 31 and 32. Here, the heat absorbing member 90 may be located inside the substrate main body 12, and its specific position may not be particularly limited. As an example, the heat absorbing member 90 in this embodiment is located between the first semiconductor element 21 and the second semiconductor element 22.

The heat absorbing member 90 is connected to the fourth conductor pattern 64 through one or more ninth vias 79. The one or more ninth vias 79, the seventh via 77 and the eighth via 78, are made of a conductor such as copper or other metal. As a result, the heat absorbing member 90 is electrically and thermally connected to the fourth conductor pattern 64 through one or more ninth vias 79. The material constituting the ninth via 79 may not be particularly limited, and may have higher thermal conductivity than the material constituting the substrate main body 12. As an example, the material constituting the ninth via 79 may be equal to the material constituting the fourth conductor pattern 64. The heat absorbing member 90 has a relatively large volume and can absorb a relatively large amount of heat, for example, similar to the heat sink plates 31 and 32.

As described above, the semiconductor device 10 of the present embodiment includes the substrate main body 12, the semiconductor elements 21 and 22 arranged in the substrate main body 12, the fourth conductor pattern 64 arranged in the second circuit layer L2 located between the upper surface 12a of the substrate main body 12 and the semiconductor elements 21 and 22, and at least one heat absorbing member 90 arranged inside the substrate main body 12 and thermally connected to the fourth conductor pattern 64. According to such a configuration, the heat generated in the semiconductor elements 21 and 22 is transferred to the heat absorbing member 90 in the substrate main body 12 through the fourth conductor pattern 64 in the substrate main body 12. As a result, most of the heat generated by the semiconductor elements 21 and 22 can be diffused in the substrate main body 12, and the temperature rise of the semiconductor elements 21 and 22 can be suppressed. Further, since the fourth conductor pattern 64 and the heat absorbing member 90 are provided in the substrate main body 12, other necessary configurations such as a control circuit 50 may be arranged freely on the upper surface 12a and the lower surface 12b of the substrate main body 12. As a result, it is possible to avoid an increase in the size of the semiconductor device 10.

The semiconductor device 10 according to the first embodiment is an embodiment of the technique disclosed in the present specification, and the content of the present technique is not particularly limited. The substrate main body 12 in this embodiment is an example of the substrate in the present technology. The upper surface 12a and the lower surface 12b of the substrate main body 12 in this embodiment are examples of the first surface and the second surface of the substrate main body in the present technology, respectively. The combination of the first semiconductor element 21 and the first heat sink plate 31 and the combination of the second semiconductor element 22 and the second heat sink plate 32 in this embodiment are examples of electric components in the present disclosure. The fourth conductor pattern 64 in this embodiment is an example of the first internal conductor pattern in the present technology. The heat absorbing member 90 in this embodiment is an example of the heat absorbing unit in the present disclosure. The ninth via 79 in this embodiment is an example of the heat conductor via in the present disclosure. The second conductor pattern 62 in this embodiment is an example of the first surface conductor pattern in the present disclosure. The ninth via 79 in this embodiment is an example of the heat conductor via in the present disclosure. The third conductor pattern 63 in this embodiment is an example of a ground wiring in the present disclosure.

Embodiment 2

Figure 5:
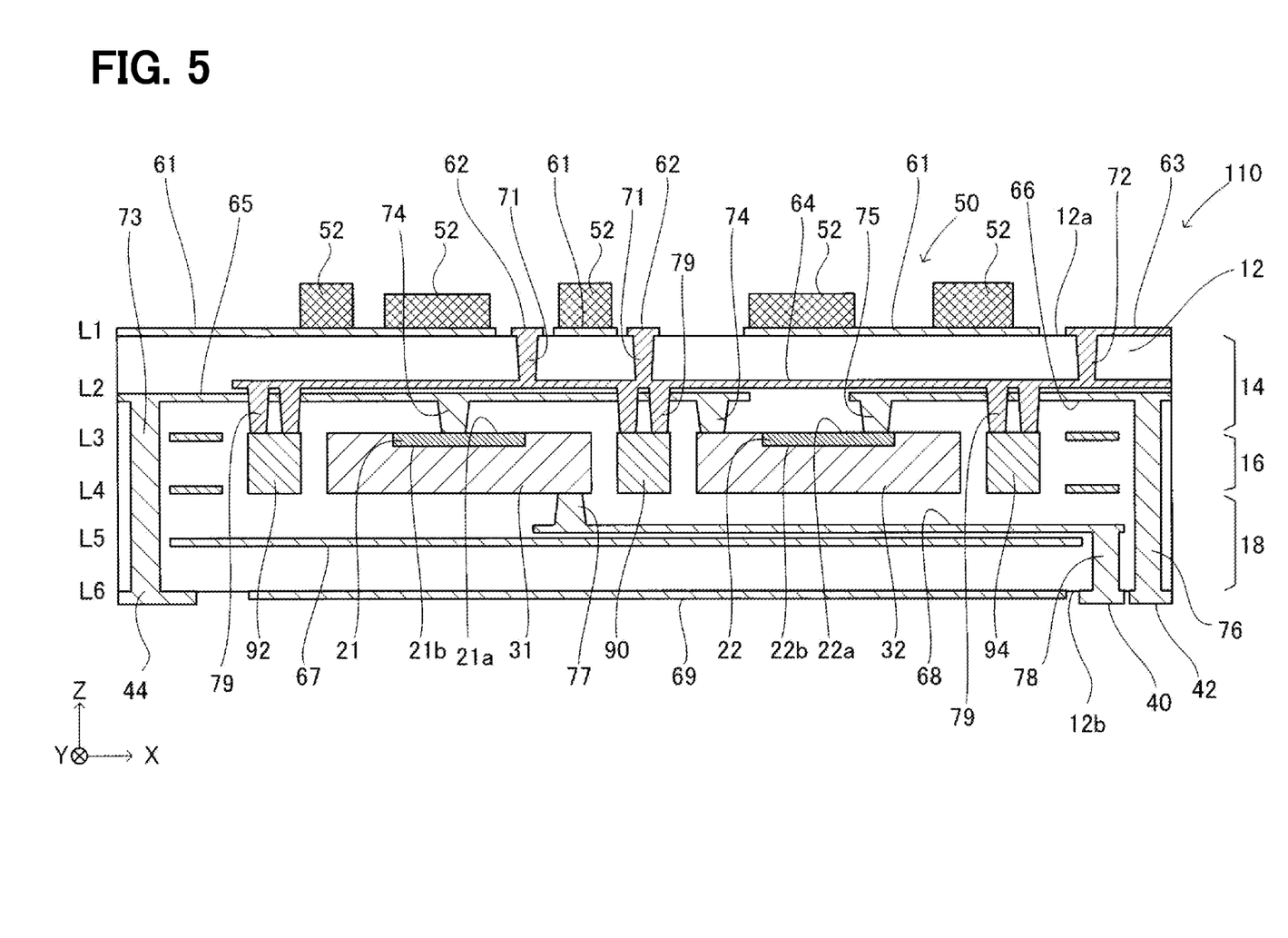
FIG. 5 is a cross-sectional view showing the configuration of the semiconductor device of the second embodiment.

The semiconductor device 110 of the second embodiment will be described with reference to FIG. 5. The semiconductor device 110 of the present embodiment includes a plurality of heat absorbing members 90, and is different from the semiconductor device 10 of the first embodiment in this respect. In the following, the differences from the first embodiment will be mainly described, and the same reference numerals will be given to the configurations common to the first embodiment, and the description thereof will be omitted.

The semiconductor device 110 of this embodiment includes a plurality of heat absorbing members 90, 92, 94 inside the substrate main body 12. Each heat absorbing member 90, 92, 94 may be made of a material having excellent thermal conductivity, and may be made of, for example, copper or other metal or graphite. The excellent thermal conductivity is, for example, approximately 170 W/m/K or more. The plurality of heat absorbing members 90, 92, 94 are located in the intermediate layer 16 of the substrate main body 12. Each heat absorbing member 90, 92, 94 is connected to the fourth conductor pattern 64 through one or more ninth vias 79.

The plurality of heat absorbing members 90, 92, 94 include a first heat absorbing member 90, a second heat absorbing member 92, and a third heat absorbing member 94. The first heat absorbing member 90 is located between the first semiconductor element 21 and the second semiconductor element 22. The second heat absorbing member 92 is located on the side opposite to the first heat absorbing member 90 with the first semiconductor element 21 interposed therebetween. The third heat absorbing member 94 is located on the side opposite to the first heat absorbing member 90 with the second semiconductor element 22 interposed therebetween.

As described above, the semiconductor device 110 of this embodiment includes a plurality of heat absorbing members 90, 92, 94. According to such a configuration, more heat can be absorbed and diffused by the plurality of heat absorbing members 90, 92, 94, and the temperature rise of the semiconductor elements 21, 22 can be further suppressed.

Embodiment 3

Figure 6:
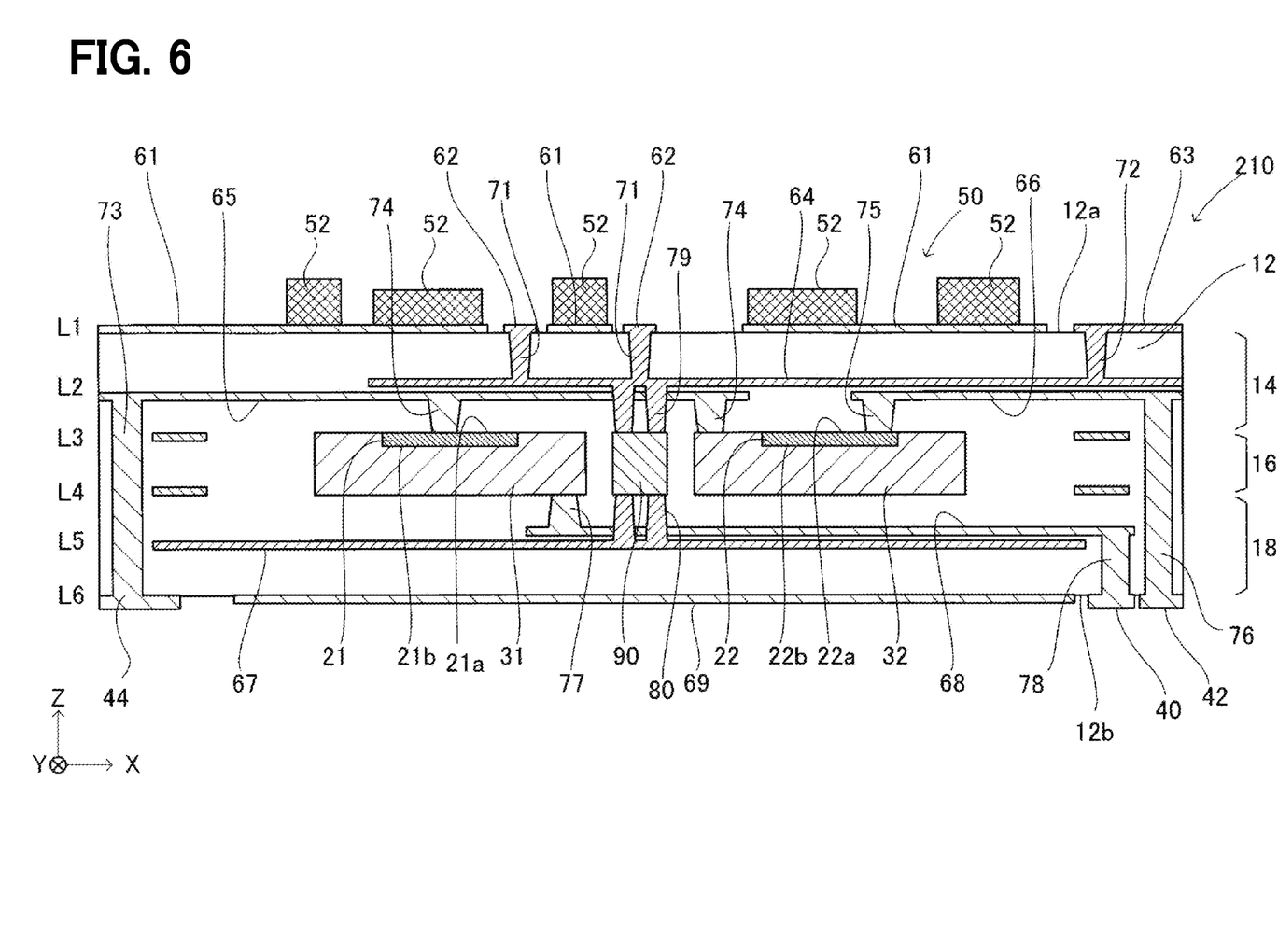
FIG. 6 is a cross-sectional view showing the configuration of the semiconductor device of the third embodiment.

The semiconductor device 210 of the third embodiment will be described with reference to FIG. 6. In the semiconductor device 210 of the present embodiment, the heat absorbing member 90 is connected to the seventh conductor pattern 67 of the fifth circuit layer L5 through one or a plurality of tenth vias 80, and in this respect, the semiconductor device 210 of the present embodiment is different from the semiconductor device 10 of the first embodiment. In the following, the differences from the first embodiment will be mainly described, and the same reference numerals will be given to the configurations common to the first embodiment, and the description thereof will be omitted.

One or more tenth vias 80 are made of a conductor such as copper or other metal. As a result, the heat absorbing member 90 is electrically and thermally connected to the seventh conductor pattern 67 through one or more tenth vias 80. The material constituting the tenth via 80 may not be particularly limited, and may have higher thermal conductivity than the material constituting the substrate main body 12. As an example, the material constituting the tenth via 80 may be equal to the material constituting the seventh conductor pattern 67.

As described above, in the semiconductor device 110 of this embodiment, the heat absorbing member 90 is also thermally connected to the seventh conductor pattern 67. According to such a configuration, the heat generated in the semiconductor elements 21 and 22 is diffused through the seventh conductor pattern 67 and transferred to the heat absorbing member 90. By arranging the semiconductor elements 21 and 22 between the fourth conductor pattern 64 and the seventh conductor pattern 67, the heat generated by the semiconductor elements 21 and 22 is effectively diffused from both sides of the semiconductor elements 21 and 22.

The seventh conductor pattern 67 in this embodiment is an example of the second internal conductor pattern in the present disclosure.

Embodiment 4

Figure 7:
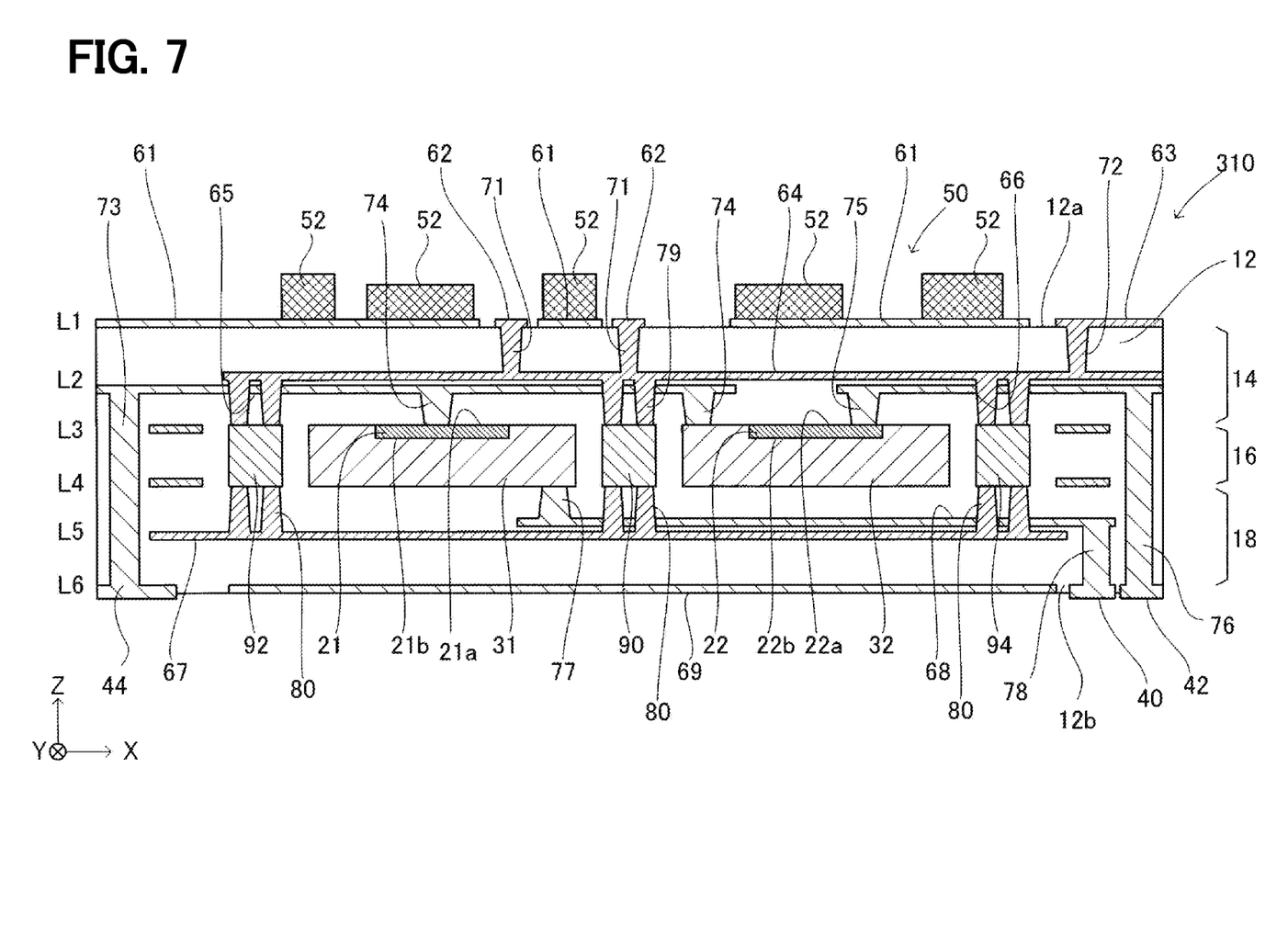
FIG. 7 is a cross-sectional view showing the configuration of the semiconductor device of the fourth embodiment.

The semiconductor device 310 of the fourth embodiment will be described with reference to FIG. 7. The semiconductor device 310 of the present embodiment includes a plurality of heat absorbing members 90, 92, 94, similarly to the semiconductor device 110 of the second embodiment. Each of the heat absorbing members 90, 92, 94 is thermally connected to the seventh conductor pattern 67 of the fifth circuit layer L5 through one or more tenth vias 80, similarly to the semiconductor device 210 of the third embodiment. That is, the semiconductor device 310 of the fourth embodiment has both the characteristics of the semiconductor device 110 of the second embodiment and the characteristics of the semiconductor device 210 of the third embodiment. Regarding this embodiment, the above-mentioned description of Embodiments 1-3 will be referred to, and the description thereof will be omitted in duplicate.

Embodiment 5

Figure 8:
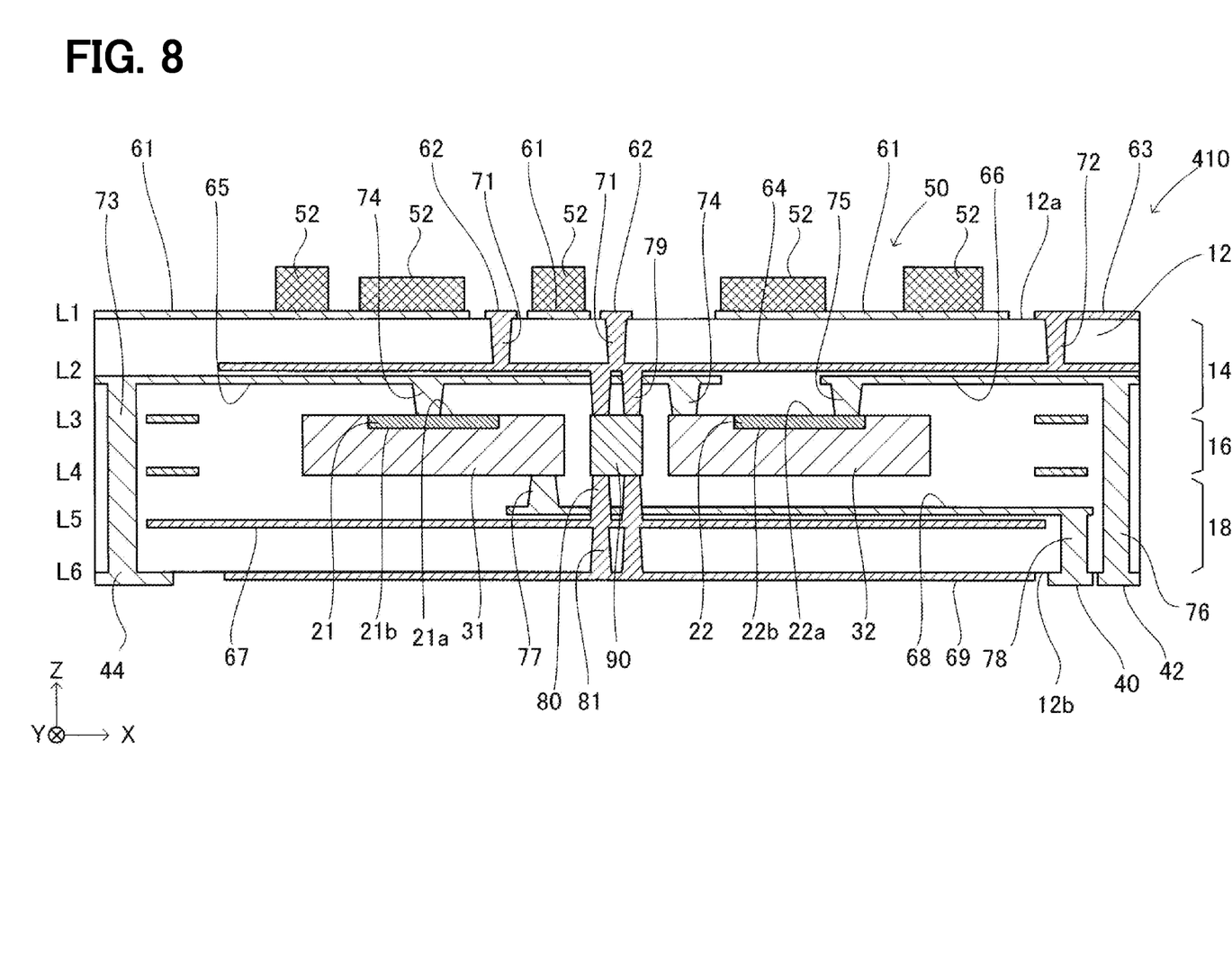
FIG. 8 is a cross-sectional view showing the configuration of the semiconductor device of the fifth embodiment.

The semiconductor device 410 of the fifth embodiment will be described with reference to FIG. 8. In the semiconductor device 410 of the present embodiment, the seventh conductor pattern 67 of the fifth circuit layer L5 is connected to the ninth conductor pattern 69 of the sixth circuit layer L6 through one or more eleventh vias 81. In this respect, it differs from the semiconductor device 10 of the third embodiment. In the following, the differences from the third embodiment will be mainly described, and the same reference numerals will be given to the configurations common to the third embodiment, and the description thereof will be omitted.

One or more eleventh vias 81 are made of a conductor such as copper or other metal. As a result, the seventh conductor pattern 67 of the fifth circuit layer L5 is electrically and thermally connected to the ninth conductor pattern 69 of the sixth circuit layer L6 through one or more eleventh vias 81. The material constituting the eleventh via 81 may not be particularly limited, and may have higher thermal conductivity than the material constituting the substrate main body 12. As an example, the material constituting the eleventh via 81 may be equal to the material constituting the ninth conductor pattern 69. Although not particularly limited, the one or more eleventh vias 81 are provided together with the one or more tenth vias 80 along the shortest path from the heat absorbing member 90 to the lower surface 12b of the substrate main body 12.

As described above, in the semiconductor device 110 of the present embodiment, the ninth conductor pattern 69 located on the lower surface 12b of the substrate main body 12 is thermally connected to the seventh conductor pattern 67 through the eleven via 81. According to such a configuration, the heat generated in the semiconductor elements 21 and 22 is transferred to the ninth conductor pattern 69 located on the lower surface 12b of the substrate body 12 through the seventh conductor pattern located inside the substrate body 12, so that the heat can be radiated to the outside from the ninth conductor pattern 69. The ninth conductor pattern 69 in this embodiment is an example of the second surface conductor pattern in the present disclosure.

Embodiment 6

Figure 9:
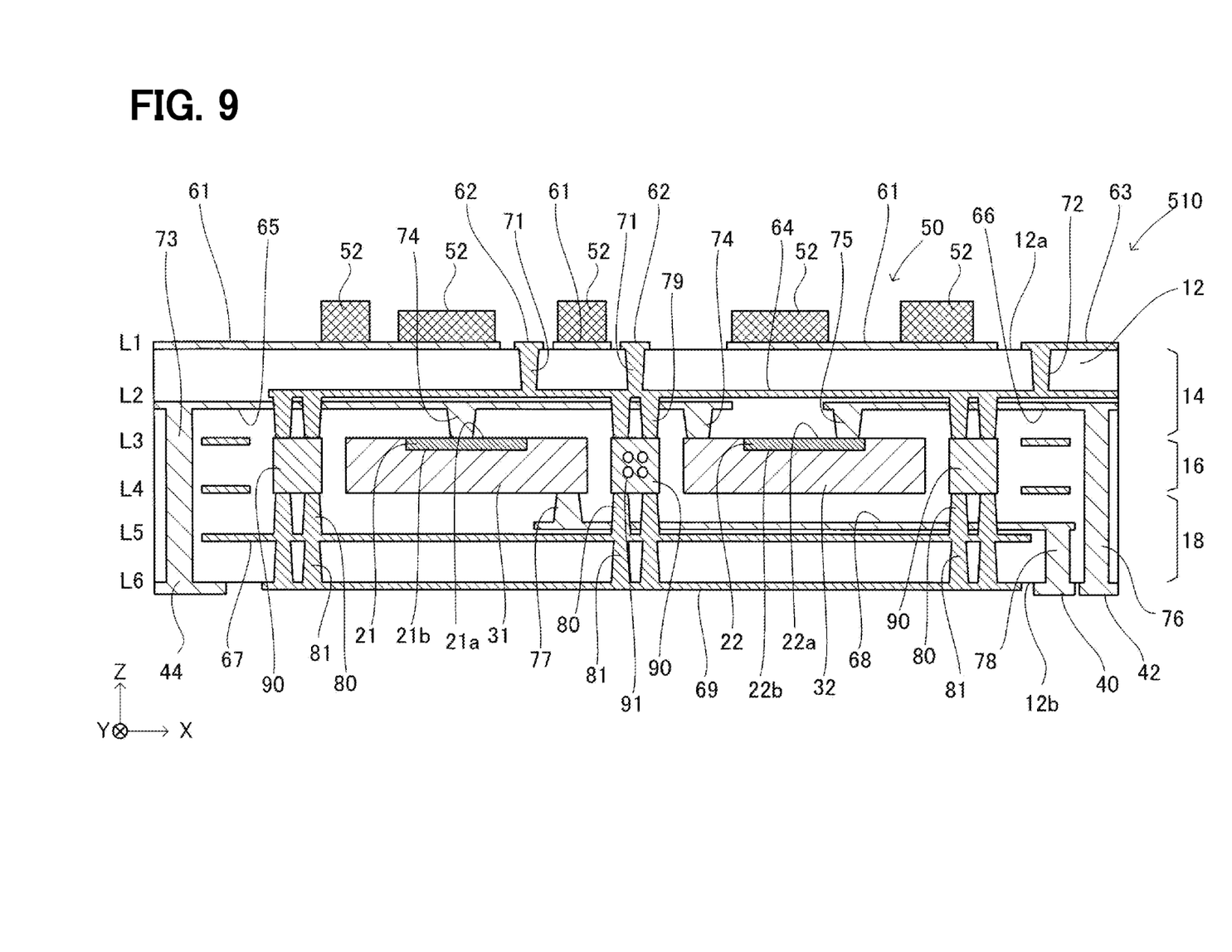
FIG. 9 is a cross-sectional view showing the configuration of the semiconductor device of the sixth embodiment.

The semiconductor device 510 of the sixth embodiment will be described with reference to FIG. 9. A plurality of eleventh vias 81 are added to the semiconductor device 510 of this embodiment as compared with the semiconductor device 310 of the fourth embodiment. Each eleventh via 78 is made of a conductor such as copper or other metal. As a result, the seventh conductor pattern 67 of the fifth circuit layer L5 is electrically and thermally connected to the ninth conductor pattern 69 of the sixth circuit layer L6 through a plurality of eleventh vias 81. Thereby, the semiconductor device 510 of the present embodiment can effectively suppress the temperature rise of the semiconductor elements 21 and 22 as compared with the semiconductor device 310 of the fourth embodiment, for example.

In addition, the heat absorbing member 90 may have a working fluid 91 enclosed therein, for example, like a heat pipe or a heat spreader. According to such a configuration, the heat transfer efficiency in the heat absorbing member 90 is increased, so that the heat absorbing property of the heat absorbing member 90 can be effectively enhanced. The heat absorbing member 90 in which the fluid 91 is enclosed may be adopted in any of the embodiments described in the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a substrate main body having a first surface and a second surface;
   an electric component arranged in the substrate main body;
   a first internal conductor pattern arranged in a first circuit layer located between the first surface and the electric component; and
   at least one heat absorbing member disposed inside the substrate main body and thermally connected to the first internal conductor pattern, wherein:
   both the at least one heat absorbing member and the electric component are disposed in an intermediate layer of the substrate main body;
   the electric component includes a first electric component and a second electric component;
   the at least one heat absorbing member is disposed between the first electric component and the second electric component;
   the at least one heat absorbing member and the electric component have substantially a same thickness in a Z-direction; and
   an upper surface of the at least one heat absorbing member and an upper surface of the electric component are disposed on substantially a same plane.

2. The semiconductor device according to claim 1, further comprising:
   a first surface conductor pattern arranged in a second circuit layer located on the first surface and thermally connected to the first internal conductor pattern.

3. The semiconductor device according to claim 2, further comprising:

a surface electric component arranged in the second circuit layer located on the first surface and controlling an operation of the electric component.

4. The semiconductor device according to claim 1, wherein:
the at least one heat absorbing member includes a plurality of heat absorbing parts.

5. The semiconductor device according to claim 1, further comprising:
a second internal conductor pattern arranged in a third circuit layer located between the second surface and the electric component, wherein:
the at least one heat absorbing member is further thermally connected to the second internal conductor pattern.

6. The semiconductor device according to claim 5, further comprising:
a second surface conductor pattern arranged in a fourth circuit layer located on the second surface and thermally connected to the second internal conductor pattern.

7. The semiconductor device according to claim 1, wherein:
the at least one heat absorbing member is made of metal or graphite.

8. The semiconductor device according to claim 1, wherein:
a working fluid is enclosed in the at least one heat absorbing member.

9. The semiconductor device according to claim 1, further comprising:
a heat conductor via extending from the first internal conductor pattern to the at least one heat absorbing member, wherein:
the heat conductor via is made of material having higher thermal conductivity than material of the substrate main body.

10. The semiconductor device according to claim 1, further comprising:
a ground wiring arranged on the first surface or the second surface of the substrate main body, wherein:
the first internal conductor pattern is electrically connected to the ground wiring in the substrate main body.

11. The semiconductor device according to claim 1, wherein:
the at least one heat absorbing member is made of material including at least graphite.

12. The semiconductor device according to claim 1, further comprising:
a plurality of second internal conductor patterns arranged in a third circuit layer located between the second surface and the electric component, wherein:
the plurality of second internal conductor patterns are arranged in a same plane in the third circuit layer.

13. The semiconductor device according to claim 1, further comprising:
a second internal conductor pattern arranged in a third circuit layer located between the second surface and the electric component, the second internal conductor pattern extends over most of the third circuit layer, the second internal conductor pattern faces the first electric component and the second electric component.

14. The semiconductor device according to claim 1, further comprising:
a second internal conductor pattern arranged in a third circuit layer located between the second surface and the electric component, the second internal conductor pattern faces one of the first electric component and the second electric component, and the second internal conductor pattern is electrically and thermally connected through a via to the one of the first electric component and the second electric component.

15. The semiconductor device according to claim 1, wherein:
the first electric component is arranged on a first heat sink plate,
the second electric component is arranged on a second heat sink plate,
the first heat sink plate and the second heat sink plate are arranged in at least the intermediate layer arranged in parallel with the substrate main body, and
the first heat sink plate and the second heat sink plate have a thickness in the Z-direction equal to a thickness in the Z-direction of the intermediate layer.

16. The semiconductor device according to claim 15, wherein
the first electric component and the first heat sink plate are integrally joined to each other, and
the second electric component and the second heat sink plate are integrally joined to each other.

17. The semiconductor device according to claim 1, further comprising:
a first surface conductor pattern arranged in a second circuit layer located on the first surface and thermally connected to the first internal conductor pattern; and
a first surface electric component and a second surface electric component arranged in the second circuit layer located on the first surface and controlling an operation of the electric component, wherein:
the first surface conductor pattern is sandwiched between the first surface electric component and the second surface electric component on the first surface.

* * * * *